(12) United States Patent
Xu et al.

(10) Patent No.: US 11,181,484 B1
(45) Date of Patent: Nov. 23, 2021

(54) SYSTEMS AND METHODS FOR ADVANCED DEFECT ABLATION PROTECTION

(71) Applicant: KLA CORPORATION, Milpitas, CA (US)

(72) Inventors: Zhiwei Xu, Sunnyvale, CA (US); Bret Whiteside, San Jose, CA (US); Steve Yifeng Cui, Fremont, CA (US); Stephen Biellak, Sunnyvale, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 16/882,603

(22) Filed: May 25, 2020

(51) Int. Cl.
*G01N 21/88* (2006.01)
*G01N 21/95* (2006.01)
*H01L 21/67* (2006.01)

(52) U.S. Cl.
CPC ..... *G01N 21/8806* (2013.01); *G01N 21/9501* (2013.01); *H01L 21/67288* (2013.01); *G01N 2201/06113* (2013.01)

(58) Field of Classification Search
CPC ........... G01N 21/8806; G01N 21/9501; G01N 2201/06113; H01L 21/67288
USPC ...................... 256/237.1–237.6, 239.1–239.8
See application file for complete search history.

(56) References Cited

U.S. PATENT DOCUMENTS

2004/0161866 A1\* 8/2004 Kang ................... G01R 31/307
438/16

\* cited by examiner

*Primary Examiner* — Tri T Ton
(74) *Attorney, Agent, or Firm* — Hodgson Russ LLP

(57) ABSTRACT

Systems, methods, and apparatuses are disclosed herein for directing, using an optical arrangement including one or more lenses, a main beam and a leading beam toward a specimen such that the main beam is incident on the specimen at a main beam incidence and the leading beam is incident on the specimen at a leading beam incidence. The main beam intensity is greater than a leading beam intensity of the leading beam. A TDI sensor receives electromagnetic radiation from the leading beam incidence, thereby generating a first accumulated charge portion, and receives electromagnetic radiation from the main beam incidence, thereby generating a second accumulated charge portion. A processor maps the first accumulated charge portion to a first FOV, thereby yielding leading beam data, and maps the second accumulated charge portion to a second FOV, thereby yielding main beam data.

20 Claims, 9 Drawing Sheets

SYSTEMS AND METHODS FOR ADVANCED DEFECT ABLATION PROTECTION

FIELD OF THE DISCLOSURE

The disclosure generally relates to semiconductor manufacturing. More particularly the disclosure generally relates to defect inspection.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Defect ablation can be a problem when inspecting a sample with a high power laser beam. Ablation happens to defects or other particles exceeding a certain size threshold, which depends on the laser beam intensity and overall dosage. Such defects, when struck by the beam, may be ablated due to the energy of the beam exploding them, which may result in the presence of many more—potentially thousands more—defects on the wafer, both in areas yet to be scanned and areas already scanned. An example of a particle distribution resulting from an exploded defect due to unintentional defect ablation is depicted in FIG. 1.

Previous techniques included using a weak leading beam to detect a larger defect before the high power main beam reaches the defect, as illustrated in FIG. 2. In this solution, signals from both beams were sent to a single sensor capable of signal output in real time, such as a photomultiplier tube (PMT) or a photodiode. When a defect passed through the weak leading beam, a signal was generated that could trigger attenuation of the main beam before it reached the defect. This approach is called laser power modulation (LPM).

However, with an increasingly powerful main beam, greater attenuation may be necessary. Since the weak leading beam and main beam are typically from the same light source, attenuation of the main beam attenuates the weak leading beam. This causes a problem when a more powerful main beam is attenuated further, leading to further attenuation of the weak leading beam. The weak leading beam, detected at the PMT or photodiode is illustrated in FIG. 3 as tracking the particle prior to the main beam read at its sensor. As can be seen, the attenuation of the leading beam can lead to a blind time period, where the leading beam and corresponding PMT sensor or photodiode sensor are unable to adequately detect a defect. Such a system would be rendered unable to detect a defect. The minimum ablatable defect size is dependent on power density and dosage from the main beam. For example, the difference between the last generation (demonstrated as "GEN 1") and the present generation (demonstrated as "GEN 2") results in additional attenuation of the leading beam and thus an increase of the minimum defect size detectable by the leading beam. This is undesirable as defects large enough to ablate are not detectable by the leading beam. Thus, the potentially necessary attenuation of the main beam can render the weak leading beam insufficient to detect the presence of a large defect using a charge-coupled device (CCD) sensor, PMT, or photodiode.

One attempt at solving the problem posed by an attenuated weak leading beam is the replacement of the PMT, photodiode, or CCD that detects the main beam and weak leading beam with a time-delay and integration (TDI) sensor to detect a further attenuated weak leading beam signal. However, this solution would not output a signal detecting a large defect until the main beam has already passed through the defect because a TDI sensor is an integrator.

Another attempt at solving the problem posed by an attenuated weak leading beam is the use of two sensors. The main beam may be sent to a TDI sensor, and the leading beam is sent to another sensor, e.g. a PMT, photodiode, or TDI sensor. Use of a CCD in this design suffers from low-photon issues when trying to detect the leading beam signal, and is impractical by itself, and cost-prohibitive if an intensifier is used. This approach has several problems, including but not limited to the cost of adding another sensor for the weak leading beam—particularly if it is a TDI sensor, as depicted in a configuration in FIG. 4—and the complexity of adding another dedicated channel.

Therefore, an improved way to detect defects and attenuate a main beam of an inspection tool is needed.

SUMMARY OF THE DISCLOSURE

In an instance, a system may comprise a stage including a specimen disposed thereon, an optical arrangement including one or more lenses, a time-delay and integration (TDI) sensor, and a processor in electronic communication with the TDI sensor. The one or more lenses may be configured to direct a main beam and a leading beam toward the specimen such that the main beam is incident on the specimen at a main beam incidence and the leading beam is incident at a leading beam incidence. The TDI sensor may be configured to receive electromagnetic radiation from the leading beam incidence and thereby generate a first accumulated charge portion. The TDI sensor may also be configured to receive electromagnetic radiation form the main beam incidence and thereby generate a second accumulated charge portion. The processor may be configured to map the first accumulated charge portion to a first field of view and thereby yield leading beam data and map the second accumulated charge portion to a second field of view and thereby yield main beam data.

The optical arrangement may be configured to selectively attenuate the main beam. The optical arrangement may selectively attenuate the main beam by adjusting the power of an emitter configured to emit a beam from which the main beam is a portion of. The optical arrangement may be configured to selectively attenuate the main beam by adjusting the power of a main beam emitter configured to emit the main beam. The optical arrangement may be configured to selectively attenuate the main beam by adjusting one or more lenses of the optical arrangement. The optical arrangement may be configured to selectively attenuate the main beam by adjusting an attenuator included in the optical arrangement.

The processor may be configured to use the leading beam data to determine a probable defect at the leading beam incidence and instruct the optical arrangement to attenuate the main beam.

The optical arrangement may further comprise an offset element configured to redirect the electromagnetic radiation received from the leading beam incidence to the TDI sensor. The offset element may be a diffractive element or an extension of an optical path of the electromagnetic radiation received from the leading beam incidence.

The optical arrangement may further include an emitter configured to emit a beam comprising electromagnetic radiation. The optical arrangement may further include one or more beam splitters. The optical arrangement may be configured to split the beam into the main beam and the leading beam.

The optical arrangement may further comprise a main beam emitter configured to emit the main beam and a leading beam emitter configured to emit the leading beam.

The system may further comprise an actuator operatively connected to the stage. Operation of the actuator may thereby result in rotational or translational motion of the stage and the specimen disposed thereon.

In another instance, a method may comprise providing a specimen disposed on a stage, directing, using an optical arrangement, a main beam and a leading beam toward the specimen such that the main beam may be incident on the specimen at a main beam incidence and the leading beam may be incident on the specimen at a leading beam incidence. At a TDI sensor, electromagnetic radiation from the leading beam incidence may be received, thereby generating a first accumulated charge portion. At the TDI sensor, electromagnetic radiation from the main beam incidence may be received, thereby generating a second accumulated charge portion. At a processor in electronic communication with the TDI sensor, the first accumulated charge portion may be mapped to a first field of view, thereby yielding leading beam data. At the processor, the second accumulated charge portion may be mapped to a second field of view, thereby yielding main beam data.

The method may further comprise, at the processor, using the leading beam data, determine a probable defect at the leading beam incidence and instruct the optical arrangement to attenuate the main beam. The method may further comprise attenuating the main beam using the optical arrangement.

Attenuating the main beam may include adjusting the power of an emitter of the optical arrangement configured to emit a beam from which the main beam is a portion of. Attenuating the main beam may include adjusting the power of a main beam emitter of the optical arrangement configured to emit the main beam. Attenuating the main beam may include adjusting one or more lenses of the optical arrangement. Attenuating the main beam may include adjusting an attenuator included in the optical arrangement.

The method may further comprise determining, at the processor, an attribute of a defect using the main beam data.

The method may further comprise emitting a beam comprising electromagnetic radiation from an emitter of the optical arrangement. The method may further comprise splitting the beam into the main beam and the leading beam using one or more beam splitters of the optical arrangement.

The method may further comprise emitting a main beam from a main beam emitter of the optical arrangement. The method may further comprise emitting the leading beam from a leading beam emitter of the optical arrangement.

The method may further comprise operating an actuator operatively connected to the stage, thereby rotating or translating the stage and the specimen disposed thereon.

In an instance, a non-transitory computer-readable storage medium may comprise one or more programs for executing steps on one or more computing devices, the steps including mapping a first accumulated charge portion to a first field of view, thereby yielding leading beam data, and mapping a second accumulated charge portion to a second field of view, thereby yielding main beam data. The first accumulated charge portion is generated at a TDI sensor as a result of electromagnetic radiation received from a leading beam incidence. A leading beam is directed using an optical arrangement including one or more lenses toward a specimen disposed on a stage such that the leading beam is incident on the specimen at the leading beam incidence. The second accumulated charge portion is generated at the time-delay and integration sensor as a result of electromagnetic radiation received from a main beam incidence. A main beam is directed using the optical arrangement toward the specimen such that the main beam is incident on the specimen at the main beam incidence.

The leading beam may comprise electromagnetic radiation. The main beam may comprise electromagnetic radiation.

The main beam may have a main beam intensity greater than a leading beam intensity of the leading beam.

The specimen may be a blank wafer. The specimen may be a patterned wafer.

The leading beam incidence and the main beam incidence may be separated on the specimen by a predetermined distance.

BRIEF DESCRIPTION OF THE FIGURES

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Figure 1:
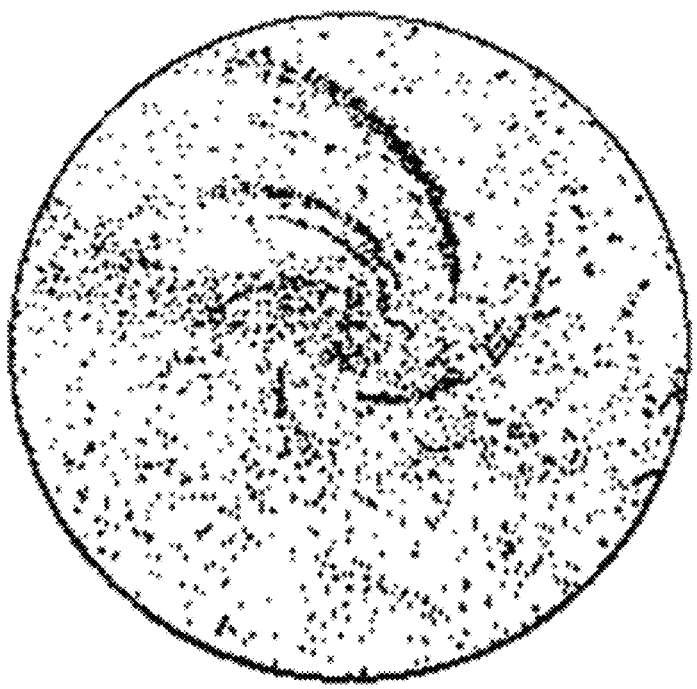
FIG. 1 illustrates example results of defect ablation.
Figure 2:
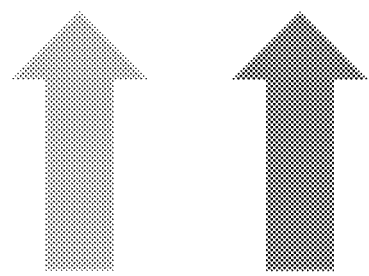
FIG. 2 illustrates an example configuration of a laser power modulation approach.
Figure 2:
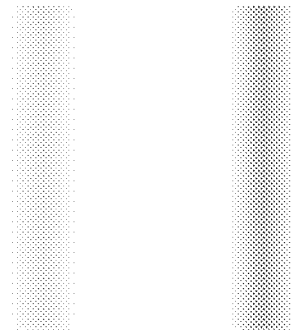
Figure 3:
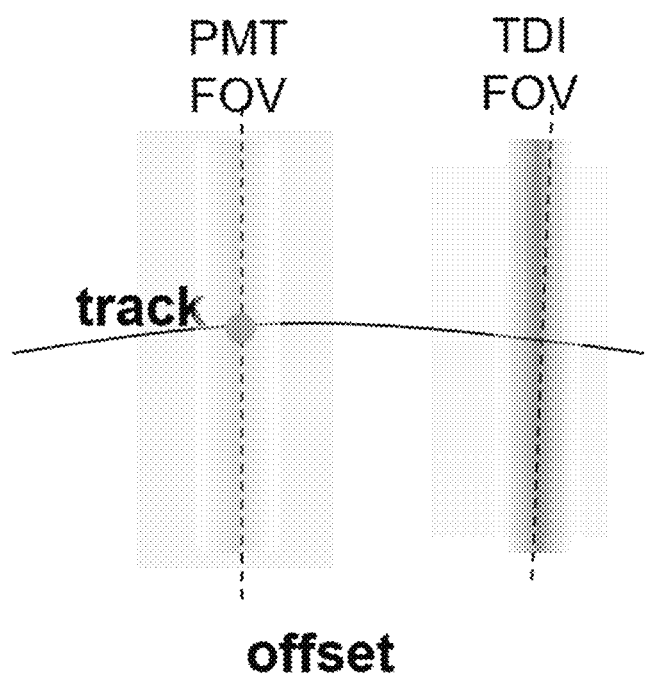
FIG. 3 illustrates an example leading beam signal and main beam signal readout for a two-sensor configuration.
Figure 4:
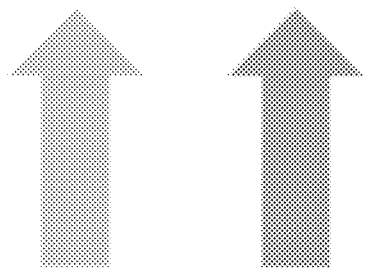
FIG. 4 illustrates an example two-sensor configuration.
Figure 4:
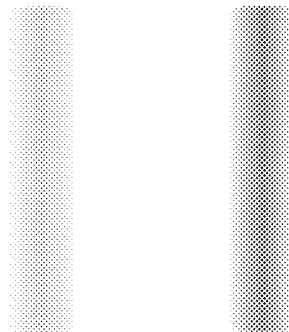
Figure 5:
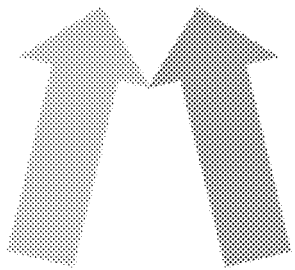
FIG. 5 illustrates an embodiment of a configuration in accordance with the present disclosure.
Figure 5:
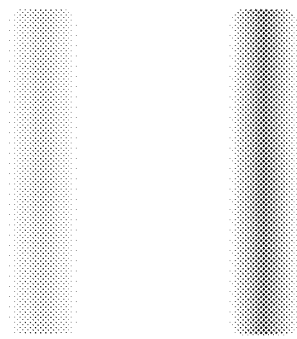
Figure 6:
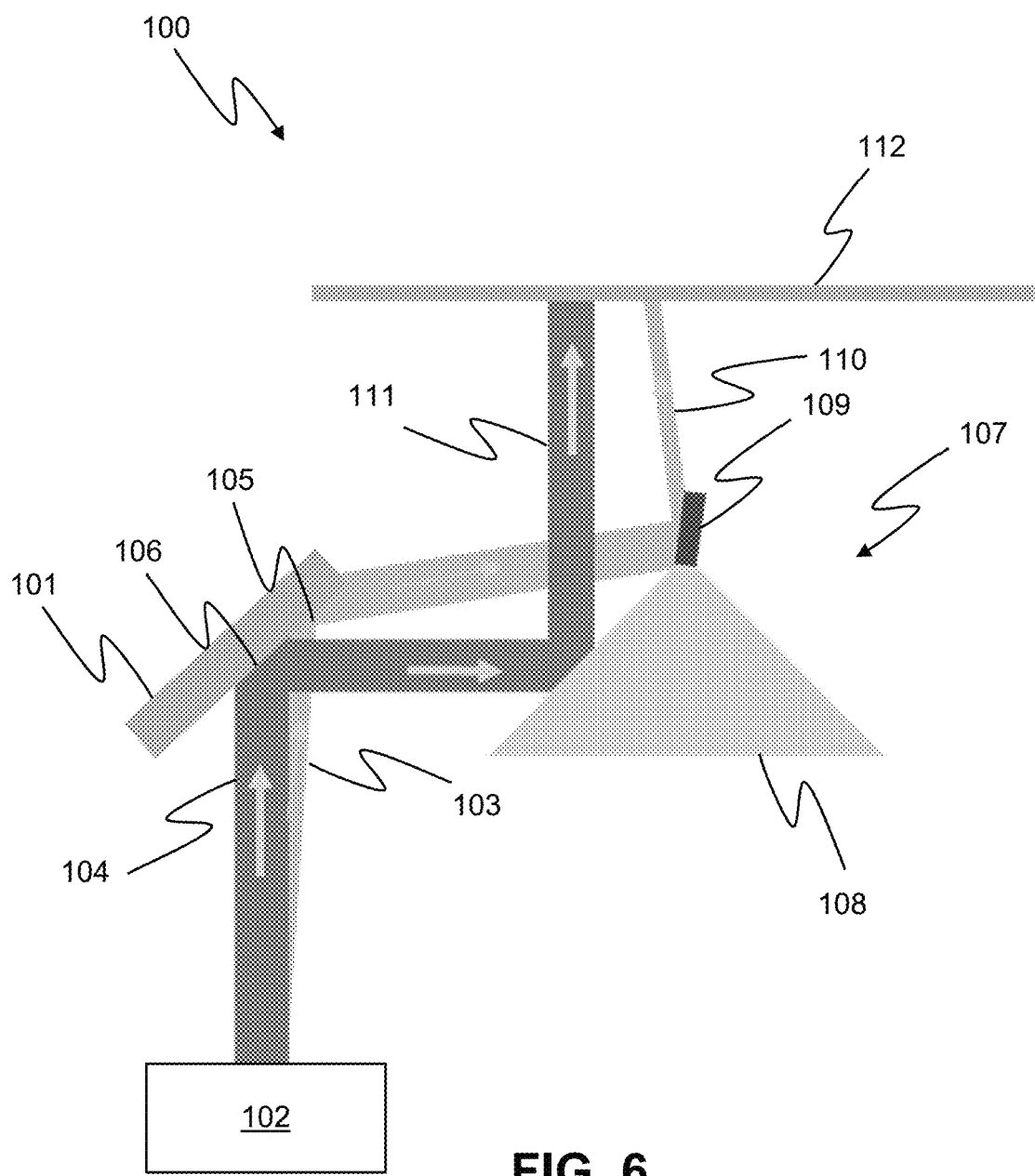
FIG. 6 illustrates an embodiment of a system in accordance with the present disclosure.

Embodiments disclosed herein include systems and methods for defect ablation protection. Such embodiments may employ a method wherein one time-delay and integration (TDI) sensor may detect both the leading beam and the main beam, as illustrated in FIG. 5. To accomplish this, the TDI sensor may be mapped to two separate areas on the sample, for instance a first field of a view and a second field of view as illustrated in FIG. 6. When a defect passes through the first field of view, a signal may be produced at the TDI output. As long as this signal is produced before the defect reaches the main beam, this signal can be used to produce a trigger signal to attenuate the main beam.

A charge-coupled device (CCD) is a type of image sensor used to convert incident light into an electrical readout. A single pixel in a CCD comprises a semiconductor and a capacitor. As photons strike the semiconductor, electrons are freed as described by the photoelectric effect. These electrons are accumulated as a charge packet at the capacitor. In a typical CCD sensor, a defined accumulation period is used, where a shutter is opened and closed to permit a limited window in which photons may fall incident on the sensor to yield accumulated charge packets.

To form a one-dimensional CCD, a plurality of pixels may be placed in a column, to form a column of CCD pixels. After accumulation, a vector of charge packets are accumulated in the column of pixels. Let $P_0$ to $P_{n-1}$ represent each pixel in the column, with n representing the number of pixels in the column. $P_0$ may represent the pixel that is read out of the column. Let $C(P_i)$ represent a charge packet at a given pixel, where $C(P_0)$ corresponds to the charge packet accumulated at $P_0$, $C(P_1)$ corresponds to the charge packet accumulated at $P_1$, and so on to $C(P_{n-1})$ corresponding to the charge packet accumulated at $P_{n-1}$. After accumulation, a column read operation may proceed in two parts. First, $C(P_0)$, is read—typically after being amplified. Second, voltage modulation may be used to shift each of the charge packets over one pixel. Such a shift may be generally described as setting each $C(P_i)$ equal to $C(P_{i+1})$. Subsequent column read operations are performed until the charge packet at each column has been read.

To form a two-dimensional CCD, a plurality of columns of pixels may be arranged to form a two-dimensional array of pixels. In this array, each pixel in a column may form a row with corresponding pixels located orthogonal to the pixel's own column in other columns. A shift register may be located at an end of the columns. Let n represent the number of pixels in each column and let m represent the number of columns. Let $P_{0,0}$ to $P_{0,n-1}$ represent each pixel in the first column, $P_{1,0}$ to $P_{1,n-1}$ represent each pixel in the second column, and so on to $P_{m-1,0}$ to $P_{m-1,n-1}$ representing each pixel in the mth column. Thus an n rows×m columns array of pixels is formed. Let $C(P_{i,j})$ represent the charge packet at any given pixel, where i represents the column the pixel is in and j represents the row the pixel is in. Let $C(P_{0,0})$ to $C(P_{m,0})$ represent charge packets at the row of pixels accessible at the shift register. After accumulation, a row read operation may be proceed in two parts. First, each $C(P_{0,0})$ to $C(P_{m,0})$ is read into the shift register, and the shift register may output the voltage values of each of the charge packets as a serial output until the shift register is cleared. Second, voltage modulation may be used to shift each of the rows of pixels to the next row of descending magnitude. Such a shift may be generally described as setting each $C(P_{i,j})$ equal to $C(P_{i,j+1})$. Subsequent row read operations are performed until the charge packets of each row are read.

A line-scan sensor, or line-scan CCD, may implement a one-dimensional CCD. In such an implementation, either the line scanner or the object being scanned moves, or both, such that, relatively, the object traverses the line scanner. It should be noted that the object may be stationary and the line scanner may move, or both may move. As the object traverses the line scanner, the line scanner performs a column read operations to read each charge packet collected in the column. The line resolution of the scanner thus a function of the speed of the line-scanner and the object moving relative to it.

Typically, line-scan sensors require a highly luminescent light sources to provide sufficient light reflecting from objects to be captured by the sensor in order to produce a sufficient image. Low light may not work well, as when not enough light falls incident on the sensor, not enough charges are accumulated in the charge packets. In such a circumstance, the sensor can produce either a faded image or no image at all.

In typical CCD sensors, it is further desirable for the column or row read operations to be performed at the highest possible frequency, thus providing the fastest possible digitization of the image.

A TDI sensor is a specialized CCD sensor. The ability to perform line scans of objects with light that would be insufficient for a typical line-scan CCD, i.e., a one-dimensional CCD is provided for in a TDI sensor. A TDI sensor is a two-dimensional CCD where the frequency of row read operations is synchronized with the relative movement of the object being scanned, and the charges are integrated rather than simply shifted as in a normal two-dimensional CCD.

A TDI sensor's operation can be described similar to a two-dimensional CCD, but with some differences. Similar to a two-dimensional CCD, a plurality of columns of pixels may be arranged to form a two-dimensional array of pixels. In this array, each pixel in a column may form a row with corresponding pixels located orthogonal to the pixel's own column in other columns. In this array, each pixel in a column may form a row with corresponding pixels located orthogonal to the pixel's own column in other columns. A shift register may be located at an end of the columns. Let n represent the number of pixels in each column and let m represent the number of columns. Let $P_{0,0}$ to $P_{0,n-1}$ represent each pixel in the first column, $P_{1,0}$ to $P_{1,n-1}$ represent each pixel in the second column, and so on to $P_{m-1,0}$ to $P_{m-1,n-1}$ representing each pixel in the mth column. Thus an n rows×m columns array of pixels is formed. Let $C(P_j)$ represent the charge packet at any given pixel, where i represents the column the pixel is in and j represents the row the pixel is in. Let $C(P_{0,0})$ to $C(P_{m,0})$ represent the charge packets at the row of pixels accessible at the shift register and $C(P_{0,n})$ to $C(P_{m,n})$ represent the charge packets at the row of pixels at the beginning of the sensor, i.e. referencing the first row of pixels that receive light from the object. Further, let $C(P_{0,n})$ to $C(P_{m,n})$ represent the charge packets of the row of pixels at the far end of the array of pixels from the row accessible at the shift register.

Unlike a standard CCD, a TDI sensor does not wait for a specified accumulation period to read the charge packets at each pixel. A TDI sensor employs a continuous read operation, similar to a line-scan CCD.

The frequency of a TDI sensor's row read operation is synchronized with the relative movement of the object being scanned. Accumulation is continuous for each row. Row read operations are performed continuously while the TDI scanner is operating. A row read operation for a TDI sensor may proceed in two parts.

First, each $C(P^{0,0})$ to $C(P^{m,0})$ is read into the shift register, and the shift register may output the voltage values of each of the charge packets as a serial output until the shift register is cleared. Second, voltage modulation may be used to add, rather than shift, each of the rows of pixels to the next row of descending magnitude. Such a shift may be generally described as setting each $C(P_{i,j})$ equal to the sum of $C(P_{i,j})$ and $C(P_{i,j+1})$. In this way, the charge packets $C(P_{0,0})$ to $C(P_{m,0})$ represent an integration of the charge packets in each respective column. Since the frequency of the row read operations are synchronized with the relative velocity of the object being scanned, each pixel in a given column receives light from the same location of the object, and thus the charge packet values $C(P_{0,0})$ to $C(P_{m,0})$ read out at the shift register once the portion of the object reaches the end of the TDI sensor represents a single line of the object, similar to the output of a line-scanner.

The primary difference between a TDI sensor and a line-scan CCD is that the output line of charge packets represents a summation of several rows of charge packets for the same line of the object being scanned. This enables the TDI sensor to function with lower light than a line-scan CCD. Line-scan CCD's often require high-luminosity external sources of light to provide light to reflect off the object to be scanned in order to provide sufficient photons striking the pixels, and thus sufficient charge accumulation to produce an image. The TDI sensor diminishes or eliminates this requirement, as it can be viewed as the sum of several line-scanners in a single sensor.

An embodiment is depicted in FIG. 6 as system 100. System 100 may comprise a stage. A specimen may be disposed on the stage. The stage may be configured to move for the inspection to take place. This may be rotational or translational motion (e.g., motion in either or both of an x- and y-direction). Movement of the stage thus moves specimen, allowing the optical arrangement 102 and TDI sensor 112 to detect defects at various locations on the specimen.

The stage may be configured to move in a variety of ways. One embodiment may include a stage driven rotationally by a combination of one or more actuators. Another embodiment may include a stage driven in translational motion by a combination of one or more actuators. Actuators in various embodiments may include servo or stepper motors, hydraulic, pneumatic, or electromagnetic pistons may be used as an actuator. Belts, pulleys, gears, worm drives, cams, rack-and-pinions, solenoids, other devices, or any combination thereof, may be used to operatively connect an actuator to the stage such that kinetic energy may be transferred from the actuator to the stage.

The specimen 101 itself may be a blank wafer. In this way the blank wafer may be inspected for defects, e.g., dust particles, arising from manufacturing, transport, storage, or other causes. In other embodiments, the specimen may be a patterned wafer.

The system may further comprise an optical arrangement 102. The optical arrangement 102 may include, for example, one or more lenses, pinhole apertures, beams splitters, fiber optic elements, or other reflective, refractive, or diffractive elements. The one or more lenses may be configured to direct a main beam 104 and a leading beam 103 toward the specimen. The main and leading beams 104, 103 may comprise electromagnetic radiation. For example, the main and leading beams 104, 103 may be of the same wavelength, as they may be provided by the same source emitter. The emitter may be part of the optical arrangement.

The main beam 104 may be incident on the specimen 101 at a main beam incidence 106, and the leading beam 103 may be incident on the specimen 101 at a leading beam incidence 105. The main beam incidence 106 and the leading beam incidence 105 may be separated on the specimen 101 by a predetermined distance. This predetermined distance may be determined as a straight-line distance or an arc length. A user may input the predetermined distance or it may be computed based on the requirements of a particular inspection. Optimally, the predetermined distance may be determined such that the distance enables leading beam data to be determined and used to attenuate the main beam prior to the main beam reaching a defect. In this way, as the specimen 101 is moved, the leading beam incidence 105 may track ahead of the main beam incidence 106.

The predetermined distance may be such that the centers of the beams may be offset in time so as to avoid interference. The main beam and leading beam may be offset in time using a pulsed laser source for the emitter. Such an offset in time may include pulses offset by, for example a multiple of the pulse duration greater than one. In one example embodiment, the pulse duration may approximately 10 picoseconds, meaning the offset may be accomplished by adding greater than approximately 3 millimeters to the optical path of leading beam 103 relative to that of main beam 104.

The predetermined distance may be such that the centers of the beams may be offset in space so as to avoid interference. The beam size for the main beam and leading beam may be, for example, from 1 µm to hundreds of µm. An offset in space may be, for example, an offset of the leading beam 103 greater than, for example two times the beam size from the main beam 104.

The system may further include a TDI sensor 112. The TDI sensor 112 may be configured to receive electromagnetic radiation and convert the same into accumulated charges.

In one aspect, the TDI sensor 112 may receive electromagnetic radiation 110 from the leading beam incidence 105 and thereby generate a first accumulated charge portion.

System 100 may include post-specimen optics 107, which may include reflector 108 and diffraction grating 109. Electromagnetic radiation 110 may be diffracted at diffraction grating 109 in order to redirect it to TDI sensor 112. The diffraction grating 109 may be efficient such that, for example, light loss may be less than 70%.

Figure 7:
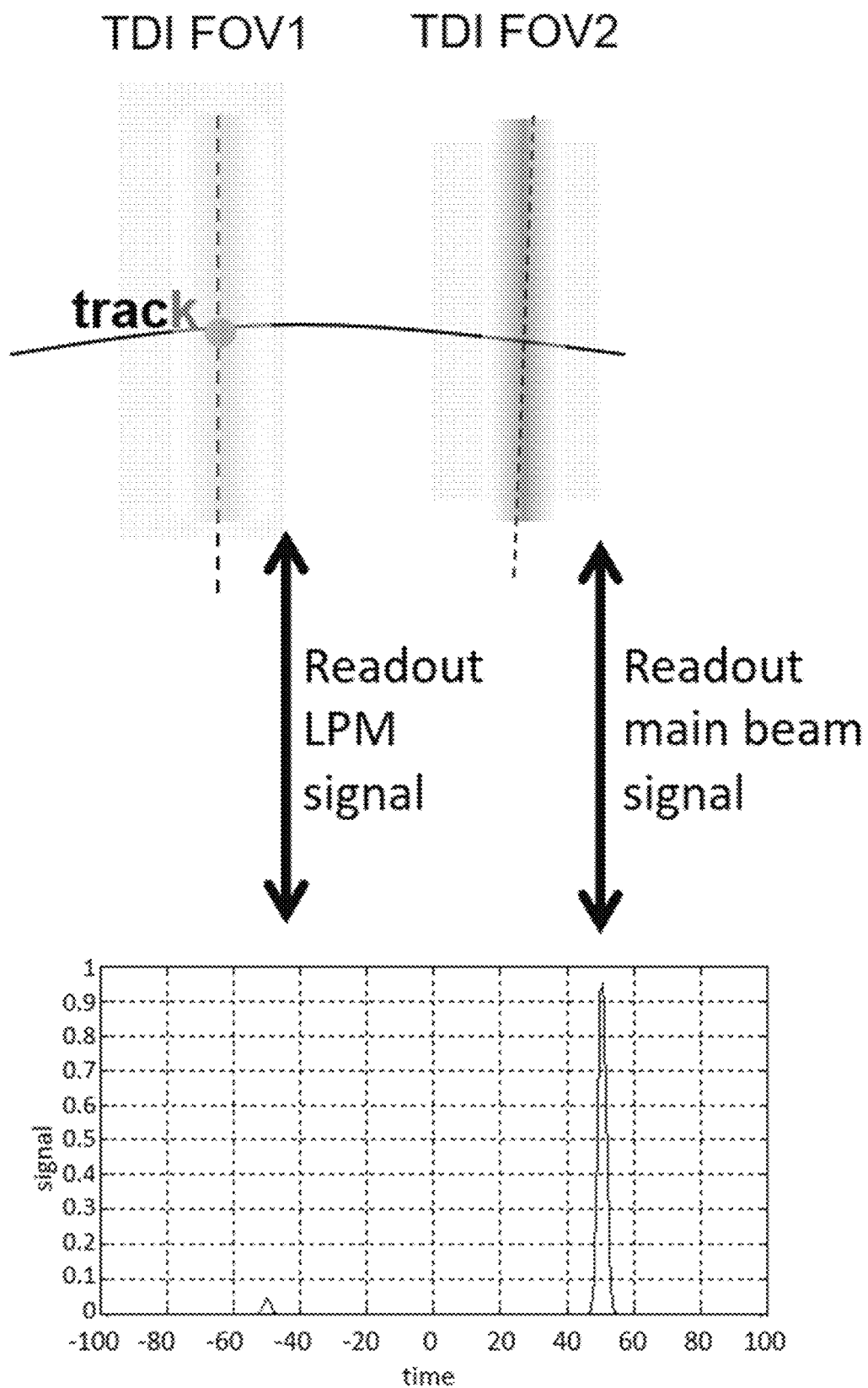
FIG. 7 illustrates the readout of two fields of view.

A diffractive element or grating 109 may be used to guide the leading beam 103 to the TDI sensor 112. The diffractive grating 109 may be configured to have a small surface area so as to not interfere with other beam paths. Diffractive grating 109 may be configured to have a focusing power such that the entire leading beam 103 may be imaged on the TDI sensor 112, as depicted in FIG. 7. Preferably, the leading beam 103 and the main beam 104 may be redirected to the TDI sensor 112 using the same diffractive grating 109.

In another aspect, the TDI sensor 112 may receive electromagnetic radiation 111 from the main beam incidence 106 and thereby generate a second accumulated charge portion.

Electromagnetic radiation 110 may be reflected at reflector 108 in order to redirect it to TDI sensor 112. Reflector 108 may be a reflective device or article sufficient to reflect electromagnetic radiation 110. Such reflector 108 may be, for example, a mirror.

The system may further comprise a processor. The processor may be in electronic communication with the TDI sensor 112. The processor may be configured to map accumulated charge portions read from the TDI sensor. This mapping may be done to two fields of view (TDI FOV1 and TDI FOV2) as depicted in FIG. 7. It should be noted that the electromagnetic radiation received from the main beam incidence 106 may be magnified, so as to ensure that the entire TDI FOV2 is spanned.

For example, the TDI sensor may provide a two-dimensional signal, which may be reduced to a one-dimensional signal using a field-programmable gate array (FPGA) by considering the maximum of each readout. This may increase efficiency as it may not matter which pixel sees a large defect as long as any pixel sees a large defect, the main beam may be attenuated by triggering laser power modulation.

In this way, the location on the wafer optically mapped to TDI FOV1 and the location on the wafer optically mapped to TDI FOV2 can be observed simultaneously. Thus, the leading beam provides a look-ahead to a location to determine if a defect is present, and provokes instructions to attenuate the main beam prior to the main beam's arrival at the location. As such, a defect that would be ablated by the full-power main beam is instead scanned by an attenuated main beam, and not ablated.

For example, the determination of whether a defect is present may be performed using a signal having its DC background (e.g., haze) removed and compared to a predetermined threshold. Laser power modulation (e.g., attenuation of the beam emitted by the emitter) may be triggered if the signal is above the predetermined threshold.

The intensity ratios of a defect can be used to ameliorate over-triggering of laser power modulation. When a small defect passes through the main beam, a similar signal may be created as for a large defect passing through the leading beam. However, this can be identified and excised from the signal as such a small defect would only appear once as compared to a large defect seen by both the leading beam and the main beam.

The optical mapping itself may rely on the TDI sensor's characteristic as an integrator. Incident light generates charges at each pixel, which are summed with the next pixel in succession, resulting in an integrated signal. Since the output of the TDI sensor is the integrated signal, both the leading beam signal and the main beam signal may be received at the same time, but output at different times. Thus, the leading beam signal for a particle may reach the end of the TDI sensor and be read out first, before the main beam does.

In some embodiments, it is advantageous to de-magnify the electromagnetic radiation received from the leading beam incidence 105. Such de-magnification enables the entire reflected beam to fit within the TDI FOV1, meaning that if a defect passes on the fringes of the leading beam, it would still be detectable.

The processor may map the first accumulated charge portion to a first field of view. This yields leading beam data. Based on the leading beam data, the main beam may be attenuated. The determination of whether the main beam should be attenuated may be based on the determination of a probable defect at the leading beam incidence. The processor can then instruct the optical arrangement to attenuate the main beam using an attenuation means, for example, a Pockel cell or an acousto-optical modulator. Such non-mechanical means for attenuating the main beam may have a low response time compared to mechanical means (e.g., less than one millisecond)

The processor may map the second accumulated charge portion to a second field of view. This yields main beam data. The main beam data can be used to inspect the defect and determine properties of the defect.

The optical arrangement may attenuate the main beam in one of several ways. For example, the power of an emitter of the main beam, included in the optical arrangement, may be adjusted. This is applicable when both the main beam and leading beam are sourced from the same emitter and when they are sourced from different emitters. An attenuator configured to attenuate the beam or main beam may be implemented in some embodiments to selectively attenuate the main beam.

In another embodiment, the optical arrangement attenuates the main beam by adjusting one or more lenses of the optical arrangement. Such lens adjustment can, for example, adjust the focus intensity of the main beam, or focus position.

In another embodiment, the optical arrangement attenuates the main beam by adjusting an attenuator included in the optical arrangement. In such an embodiment, a suitable attenuator for the wavelength of the beam of electromagnetic radiation of the beam may be used to selectively attenuate the beam. Such an attenuator can comprise a rotary or linear attenuator.

The processor may be configured to determine an attribute of a defect using the main beam data. This can include performing metrology on the defect to determine attributes, such as critical dimension. The defect can be classified based on these attributes.

The optical arrangement may include an emitter configured to emit a beam comprising electromagnetic radiation.

The optical arrangement can further include one or more beam splitters. The optical arrangement can thus be configured to split the beam into the main beam and the leading beam. The optical arrangement may include, for example, a coated wedge or a diffractive optical element to produce a weak leading beam, which may be used to attenuate the weak leading beam, which may be more light-efficient than using a 50/50 beam splitter or 50/50 beam splitter array.

In another embodiment, the system may comprise two emitters: a main beam emitter configured to emit the main beam and a leading beam emitter configured to emit the leading beam. In this embodiment, the optical arrangement may be configured such that both beams share optical components in the optical arrangement.

In another embodiment, the system has two TDI FOV like in FIG. 7. The two TDI FOV can be used in the system to detect different portions of dark-field scatter from the main beam. A third FOV can be added to the sensor. Two FOV can be used for dark-field scatter and one FOV can be used for the leading-beam detection.

For example the two TDI FOV are typically driven and have the signals read from the long edges of the TDI. With two TDI sections, this may be accomplished in a compact space. One of the TDI sections can use the outer edge and the other TDI section can use the opposite outer edge. With three TDI sections, access to the middle section on the silicon can be difficult without separation between all three sections.

Thus, two TDI FOV can be maintained for the two portions of dark field scatter and an array of avalanche photodetector (APD) or photon-counting detectors is added between the two TDI FOV in the sensor (such as the sensor 112) to detect the leading beam. The drive and read electronics of the APD or photon-counting arrays may be simpler than that of the TDI. The APD can be sensitive and fast and can provide sufficient performance to enable the leading beam function. Thus, the functionality of the existing system may be maintained with an additional detection element of the secondary beam located in between the two TDI sections.

In this embodiment, the APD array can be bonded to the TDI chip between the two TDI FOV. The APD array can be independently fabricated and bonded at the last step.

The APD array can be designed independently of the TDI, and can be separately optimized for main-beam functionality.

Figure 8:
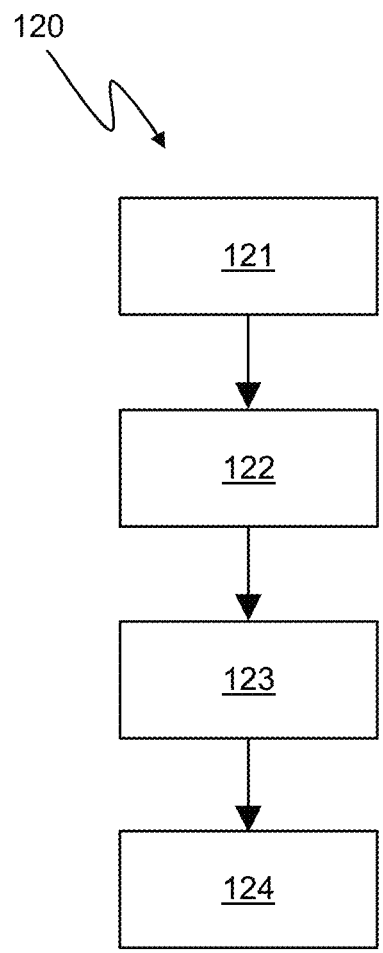
FIG. 8 illustrates an embodiment of a method in accordance with the present disclosure.

Another embodiment is illustrated in FIG. 8 as method 120. Method 120 may comprise providing 121 a specimen disposed on a stage. Then the method 120 may include directing 122, using an optical arrangement including one or more lenses, a main beam comprising electromagnetic radiation and a leading beam comprising electromagnetic radiation toward the specimen such that the main beam is incident on the specimen at a main beam incidence and the leading beam is incident on the specimen at a leading beam incidence. Then the method 120 may include, at a TDI sensor, receiving 123 electromagnetic radiation from the leading beam incidence, thereby generating a first accumulated charge portion, and electromagnetic radiation from the main beam incidence, thereby generating a second accumulated charge portion. Then the method 120 may include, at a processor in electronic communication with the TDI sensor, mapping 124 the first accumulated charge portion to a first field of view, thereby yielding leading beam data, and the second accumulated charge portion to a second field of view, thereby yielding main beam data. The electromagnetic radiation received 123, 124 from the leading and main beam incidences may be portions of the respective leading and main beams falling incident on the specimen and reflecting or diffracting away from the specimen.

The method may implement additional aspects previously described with respect to system 100.

In another embodiment, some or all of the steps of method 120 may be performed on at non-transitory computer-readable storage medium, comprising one or more programs for executing the steps on one or more computing devices.

Figure 9:
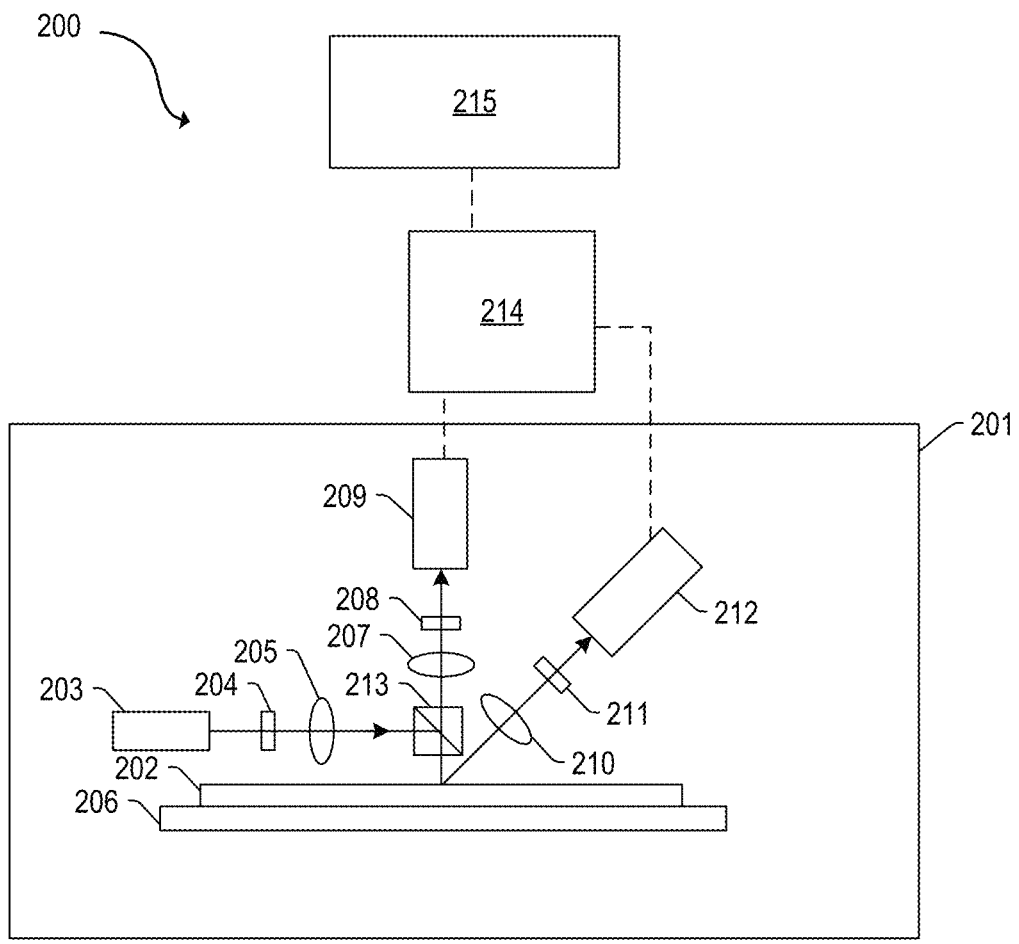
FIG. 9 illustrates an embodiment of a system in accordance with the present disclosure.

One embodiment of a system 200 is shown in FIG. 9. The system 200 includes optical based subsystem 201, and may include features from earlier. For example, the system 100 can be included in the system 200. In general, the optical based subsystem 201 is configured for generating optical based output for a specimen 202 by directing light to (or scanning light over) and detecting light from the specimen 202. In one embodiment, the specimen 202 includes a wafer. The wafer may include any wafer known in the art. In another embodiment, the specimen includes a reticle. The reticle may include any reticle known in the art.

In the embodiment of the system 200 shown in FIG. 9, optical based subsystem 201 includes an illumination subsystem configured to direct light to specimen 202. The illumination subsystem includes at least one light source. For example, as shown in FIG. 9, the illumination subsystem includes light source 203. In one embodiment, the illumination subsystem is configured to direct the light to the specimen 202 at one or more angles of incidence, which may include one or more oblique angles and/or one or more normal angles. For example, as shown in FIG. 9, light from light source 203 is directed through optical element 204 and then lens 205 to specimen 202 at an oblique angle of incidence. The oblique angle of incidence may include any suitable oblique angle of incidence, which may vary depending on, for instance, characteristics of the specimen 202.

The optical based subsystem 201 may be configured to direct the light to the specimen 202 at different angles of incidence at different times. For example, the optical based subsystem 201 may be configured to alter one or more characteristics of one or more elements of the illumination subsystem such that the light can be directed to the specimen 202 at an angle of incidence that is different than that shown in FIG. 9. In one such example, the optical based subsystem 201 may be configured to move light source 203, optical element 204, and lens 205 such that the light is directed to the specimen 202 at a different oblique angle of incidence or a normal (or near normal) angle of incidence.

In some instances, the optical based subsystem 201 may be configured to direct light to the specimen 202 at more than one angle of incidence at the same time. For example, the illumination subsystem may include more than one illumination channel, one of the illumination channels may include light source 203, optical element 204, and lens 205 as shown in FIG. 9 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen 202 at different angles of incidence may be different such that light resulting from illumination of the specimen 202 at the different angles of incidence can be discriminated from each other at the detector(s).

In another instance, the illumination subsystem may include only one light source (e.g., light source 203 shown in FIG. 9) and light from the light source may be separated into different optical paths (e.g., based on wavelength, polarization, etc.) by one or more optical elements (not shown) of the illumination subsystem. Light in each of the different optical paths may then be directed to the specimen 202. Multiple illumination channels may be configured to direct light to the specimen 202 at the same time or at different times (e.g., when different illumination channels are used to sequentially illuminate the specimen). In another instance, the same illumination channel may be configured to direct light to the specimen 202 with different characteristics at different times. For example, in some instances, optical element 204 may be configured as a spectral filter and the properties of the spectral filter can be changed in a variety of different ways (e.g., by swapping out the spectral filter) such that different wavelengths of light can be directed to the specimen 202 at different times. The illumination subsystem may have any other suitable configuration known in the art for directing the light having different or the same characteristics to the specimen 202 at different or the same angles of incidence sequentially or simultaneously.

In one embodiment, light source 203 may include a broadband plasma (BBP) source. In this manner, the light generated by the light source 203 and directed to the specimen 202 may include broadband light. However, the light source may include any other suitable light source such as a laser. The laser may include any suitable laser known in the art and may be configured to generate light at any suitable wavelength or wavelengths known in the art. In addition, the laser may be configured to generate light that is monochromatic or nearly-monochromatic. In this manner, the laser may be a narrowband laser. The light source 203 may also include a polychromatic light source that generates light at multiple discrete wavelengths or wavebands.

Light from optical element 204 may be focused onto specimen 202 by lens 205. Although lens 205 is shown in FIG. 9 as a single refractive optical element, it is to be understood that, in practice, lens 205 may include a number of refractive and/or reflective optical elements that in combination focus the light from the optical element to the specimen. The illumination subsystem shown in FIG. 9 and described herein may include any other suitable optical elements (not shown). Examples of such optical elements include, but are not limited to, polarizing component(s), spectral filter(s), spatial filter(s), reflective optical element(s), apodizer(s), beam splitter(s) (such as beam splitter 213), aperture(s), and the like, which may include any such suitable optical elements known in the art. In addition, the optical based subsystem 201 may be configured to alter one or more of the elements of the illumination subsystem based on the type of illumination to be used for generating the optical based output.

The optical based subsystem 201 may also include a scanning subsystem configured to cause the light to be scanned over the specimen 202. For example, the optical based subsystem 201 may include stage 206 on which specimen 202 is disposed during optical based output generation. The scanning subsystem may include any suitable mechanical and/or robotic assembly (that includes stage 206) that can be configured to move the specimen 202 such that the light can be scanned over the specimen 202. In addition, or alternatively, the optical based subsystem 201 may be configured such that one or more optical elements of the optical based subsystem 201 perform some scanning of the light over the specimen 202. The light may be scanned over the specimen 202 in any suitable fashion such as in a serpentine-like path or in a spiral path.

The optical based subsystem 201 further includes one or more detection channels. At least one of the one or more detection channels includes a detector configured to detect light from the specimen 202 due to illumination of the specimen 202 by the subsystem and to generate output responsive to the detected light. For example, the optical based subsystem 201 shown in FIG. 9 includes two detection channels, one formed by collector 207, element 208, and detector 209 and another formed by collector 210, element 211, and detector 212. As shown in FIG. 9, the two detection channels are configured to collect and detect light at different angles of collection. In some instances, both detection channels are configured to detect scattered light, and the detection channels are configured to detect tight that is scattered at different angles from the specimen 202. However, one or more of the detection channels may be configured to detect another type of light from the specimen 202 (e.g., reflected light).

As further shown in FIG. 9, both detection channels are shown positioned in the plane of the paper and the illumination subsystem is also shown positioned in the plane of the paper. Therefore, in this embodiment, both detection channels are positioned in (e.g., centered in) the plane of incidence. However, one or more of the detection channels may be positioned out of the plane of incidence. For example, the detection channel formed by collector 210, element 211, and detector 212 may be configured to collect and detect light that is scattered out of the plane of incidence. Therefore, such a detection channel may be commonly referred to as a "side" channel, and such a side channel may be centered in a plane that is substantially perpendicular to the plane of incidence.

Although FIG. 9 shows an embodiment of the optical based subsystem 201 that includes two detection channels, the optical based subsystem 201 may include a different number of detection channels (e.g., only one detection channel or two or more detection channels). In one such instance, the detection channel formed by collector 210, element 211, and detector 212 may form one side channel as described above, and the optical based subsystem 201 may include an additional detection channel (not shown) formed as another side channel that is positioned on the opposite side of the plane of incidence. Therefore, the optical based subsystem 201 may include the detection channel that includes collector 207, element 208, and detector 209 and that is centered in the plane of incidence and configured to collect and detect light at scattering angle(s) that are at or close to normal to the specimen 202 surface. This detection channel may therefore be commonly referred to as a "top" channel, and the optical based subsystem 201 may also include two or more side channels configured as described above. As such, the optical based subsystem 201 may include at least three channels (i.e., one top channel and two side channels), and each of the at least three channels has its own collector, each of which is configured to collect light at different scattering angles than each of the other collectors.

As described further above, each of the detection channels included in the optical based subsystem 201 may be configured to detect scattered light. Therefore, the optical based subsystem 201 shown in FIG. 9 may be configured for dark field (DF) output generation for specimens 202. However, the optical based subsystem 201 may also or alternatively include detection channel(s) that are configured for bright field (BF) output generation for specimens 202. In other words, the optical based subsystem 201 may include at least one detection channel that is configured to detect light specularly reflected from the specimen 202. Therefore, the optical based subsystems 201 described herein may be configured for only DF, only BF, or both DF and BF imaging. Although each of the collectors are shown in FIG. 9 as single refractive optical elements, it is to be understood that each of the collectors may include one or more refractive optical die(s) and/or one or more reflective optical element(s).

The one or more detection channels may include any suitable detectors known in the art. For example, the detectors may include photo-multiplier tubes (PMTs), charge coupled devices (CCDs), time delay integration (TDI) cameras, and any other suitable detectors known in the art. The detectors may also include non-imaging detectors or imaging detectors. In this manner, if the detectors are non-imaging detectors, each of the detectors may be configured to detect certain characteristics of the scattered light such as intensity but may not be configured to detect such characteristics as a function of position within the imaging plane. As such, the output that is generated by each of the detectors included in each of the detection channels of the optical based subsystem may be signals or data, but not image signals or image data. In such instances, a processor such as processor 214 may be configured to generate images of the specimen 202 from the non-imaging output of the detectors. However, in other instances, the detectors may be configured as imaging detectors that are configured to generate imaging signals or image data. Therefore, the optical based subsystem may be configured to generate optical images or other optical based output described herein in a number of ways. For example, the system 100 may be used.

It is noted that FIG. 9 is provided herein to generally illustrate a configuration of an optical based subsystem 201 that may be included in the system embodiments described herein or that may generate optical based output that is used by the system embodiments described herein. The optical based subsystem 201 configuration described herein may be altered to optimize the performance of the optical based subsystem 201 as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

The processor 214 may be coupled to the components of the system 200 in any suitable manner (e.g., via one or more transmission media, which may include wired and/or wireless transmission media) such that the processor 214 can receive output. The processor 214 may be configured to perform a number of functions using the output. The system 200 can receive instructions or other information from the processor 214. The processor 214 and/or the electronic data storage unit 215 optionally may be in electronic communication with a wafer inspection tool, a wafer metrology tool, or a wafer review tool (not illustrated) to receive additional information or send instructions. For example, the processor 214 and/or the electronic data storage unit 215 can be in electronic communication with an SEM.

The processor 214, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 214 and electronic data storage unit 215 may be disposed in or otherwise part of the system 200 or another device. In an example, the processor 214 and electronic data storage unit 215 may be part of a standalone control unit or in a centralized quality control unit. Multiple processors 214 or electronic data storage units 215 may be used.

The processor 214 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 214 to implement various methods and functions may be stored in readable storage media, such as a memory in the electronic data storage unit 215 or other memory.

If the system 200 includes more than one processor 214, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 214 may be configured to perform a number of functions using the output of the system 200 or other output. For instance, the processor 214 may be configured to send the output to an electronic data storage unit 215 or another storage medium. The processor 214 may be further configured as described herein.

If the system includes more than one subsystem, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 214 may be configured according to any of the embodiments described herein. The processor 214 also may be configured to perform other functions or additional steps using the output of the system 200 or using images or data from other sources.

Various steps, functions, and/or operations of system 200 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 214 or, alternatively, multiple processors 214. Moreover, different subsystems of the system 200 may include one or more computing or logic systems. Therefore, the above description should not be interpreted as a limitation on the present disclosure but merely an illustration.

In an instance, the processor 214 is in communication with the system 200. The processor 214 may be configured to map a first accumulated charge portion to a first field of view, thereby yielding leading beam data, wherein the first accumulated charge portion is generated at a time-delay and integration sensor as a result of electromagnetic radiation received from a leading beam incidence, wherein a leading beam comprising electromagnetic radiation is directed using an optical arrangement including one or more lenses toward a specimen disposed on a stage such that the leading beam is incident on the specimen at the leading beam incidence;

The processor 214 may be further configured to map a second accumulated charge portion to a second field of view, thereby yielding main beam data, wherein the second accumulated charge portion is generated at the time-delay and integration sensor as a result of electromagnetic radiation received from a main beam incidence, wherein a main beam comprising electromagnetic radiation is directed using the optical arrangement toward the specimen such that the main beam is incident on the specimen at the main beam incidence.

An additional embodiment relates to a non-transitory computer-readable medium storing program instructions executable on a controller for performing a computer-implemented method for mapping the first accumulated charge portion to a first field of view and mapping the second accumulated charge portion to a second field of view, as disclosed herein. In particular, as shown in FIG. 9, electronic data storage unit 215 or other storage medium may contain non-transitory computer-readable medium that includes program instructions executable on the processor 214. The computer-implemented method may include any step(s) of any method(s) described herein, including method 120.

Program instructions implementing methods such as those described herein may be stored on computer-readable medium, such as in the electronic data storage unit 215 or other storage medium. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes (MFC), Streaming SIMD Extension (SSE), or other technologies or methodologies, as desired.

The steps of the method described in the various embodiments and examples disclosed herein are sufficient to carry out the methods of the present invention. Thus, in an embodiment, the method consists essentially of a combination of the steps of the methods disclosed herein. In another embodiment, the method consists of such steps.

Although the present disclosure has been described with respect to one or more particular embodiments, it will be understood that other embodiments of the present disclosure may be made without departing from the scope of the present disclosure.

What is claimed is:

1. A system, comprising:
    a stage including a specimen disposed thereon;
    an optical arrangement including one or more lenses configured to direct a main beam comprising electromagnetic radiation and a leading beam comprising electromagnetic radiation toward the specimen such that the main beam is incident on the specimen at a main beam incidence and the leading beam is incident on the specimen at a leading beam incidence, wherein the main beam has a main beam intensity greater in magnitude than a leading beam intensity of the leading beam;
    a time-delay and integration sensor configured to:
        receive electromagnetic radiation from the leading beam incidence, thereby generating a first accumulated charge portion, and
        receive electromagnetic radiation from the main beam incidence, thereby generating a second accumulated charge portion; and
    a processor in electronic communication with the time-delay and integration sensor, the processor configured to:
        map the first accumulated charge portion to a first field of view, thereby yielding leading beam data, and
        map the second accumulated charge portion to a second field of view, thereby yielding main beam data.

2. The system of claim 1, wherein the optical arrangement is configured to selectively attenuate the main beam.

3. The system of claim 2, wherein the processor is configured to:
    using the leading beam data, determine a probable defect at the leading beam incidence; and
    instruct the optical arrangement to attenuate the main beam.

4. The system of claim 2, wherein the optical arrangement selectively attenuates the main beam by:
    adjusting the power of an emitter configured to emit a beam from which the main beam is a portion of;
    adjusting the power of a main beam emitter configured to emit the main beam;
    adjusting one or more lenses of the optical arrangement; or
    adjusting an attenuator included in the optical arrangement.

5. The system of claim 1, wherein the optical arrangement further comprises an offset element configured to redirect the electromagnetic radiation received from the leading beam incidence to the time-delay and integration sensor, wherein the offset element is a diffractive element or an extension of an optical path of the electromagnetic radiation received from the leading beam incidence.

6. The system of claim 1, wherein the optical arrangement further includes:
    an emitter configured to emit a beam comprising electromagnetic radiation; and
    one or more beam splitters;
    wherein the optical arrangement is configured to split the beam into the main beam and the leading beam.

7. The system of claim 1, wherein the optical arrangement further includes a main beam emitter configured to emit the main beam and a leading beam emitter configured to emit the leading beam.

8. The system of claim 1, wherein the leading beam incidence and the main beam incidence are separated on the specimen by a predetermined distance.

9. The system of claim 1, further comprising an actuator operatively connected to the stage such that operation of the actuator thereby results in rotational or translational motion of the stage and the specimen disposed thereon.

10. The system of claim 1, further comprising an array of avalanche photodetector or photon-counting detectors disposed adjacent to the time-delay and integration sensor.

11. A method, comprising:
    providing a specimen disposed on a stage;
    directing, using an optical arrangement including one or more lenses, a main beam comprising electromagnetic radiation and a leading beam comprising electromagnetic radiation toward the specimen such that the main beam is incident on the specimen at a main beam incidence and the leading beam is incident on the specimen at a leading beam incidence, wherein the main beam has a main beam intensity greater in magnitude than a leading beam intensity of the leading beam;
    at a time-delay and integration sensor:
        receiving electromagnetic radiation from the leading beam incidence, thereby generating a first accumulated charge portion, and
        receiving electromagnetic radiation from the main beam incidence, thereby generating a second accumulated charge portion; and
    at a processor in electronic communication with the time-delay and integration sensor:
        mapping the first accumulated charge portion to a first field of view, thereby yielding leading beam data, and
        mapping the second accumulated charge portion to a second field of view, thereby yielding main beam data.

12. The method of claim 11, further comprising:
    at the processor:
        using the leading beam data, determining a probable defect at the leading beam incidence, and
        instructing the optical arrangement to attenuate the main beam; and
    attenuating, using the optical arrangement, the main beam.

13. The method of claim 12, wherein attenuating the main beam includes:
    adjusting a power of an emitter of the optical arrangement, the emitter configured to emit a beam from which the main beam is a portion of;
    adjusting a power of a main beam emitter of the optical arrangement, the main beam emitter configured to emit the main beam;
    adjusting one or more lenses of the optical arrangement; or
    adjusting an attenuator included in the optical arrangement.

14. The method of claim 11, further comprising determining, at the processor, an attribute of a defect using the main beam data.

15. The method of claim 11, further comprising:
    emitting a beam comprising electromagnetic radiation from an emitter of the optical arrangement; and splitting the beam into the main beam and the leading beam using one or more beam splitters of the optical arrangement.

16. The method of claim 11, further comprising:
emitting the main beam from a main beam emitter of the optical arrangement; and
emitting the leading beam from a leading beam emitter of the optical arrangement.

17. The method of claim 11, wherein the leading beam incidence and the main beam incidence are separated on the specimen by a predetermined distance.

18. The method of claim 11, further comprising operating an actuator operatively connected to the stage, thereby rotating or translating the stage and the specimen disposed thereon.

19. The method of claim 11, wherein the specimen is a blank wafer or a patterned wafer.

20. A non-transitory computer-readable storage medium, comprising one or more programs for executing the following steps on one or more computing devices:

mapping a first accumulated charge portion to a first field of view, thereby yielding leading beam data, wherein the first accumulated charge portion is generated at a time-delay and integration sensor as a result of electromagnetic radiation received from a leading beam incidence, wherein a leading beam comprising electromagnetic radiation is directed using an optical arrangement including one or more lenses toward a specimen disposed on a stage such that the leading beam is incident on the specimen at the leading beam incidence;

mapping a second accumulated charge portion to a second field of view, thereby yielding main beam data, wherein the second accumulated charge portion is generated at the time-delay and integration sensor as a result of electromagnetic radiation received from a main beam incidence, wherein a main beam comprising electromagnetic radiation is directed using the optical arrangement toward the specimen such that the main beam is incident on the specimen at the main beam incidence, wherein the main beam has a main beam intensity greater in magnitude than a leading beam intensity of the leading beam.

* * * * *